United States Patent [19]

Needle

[11] Patent Number: 5,864,602
[45] Date of Patent: Jan. 26, 1999

[54] QUALIFYING TELEPHONE LINE FOR DIGITAL TRANSMISSION SERVICE

[75] Inventor: Jack Needle, Dix Hills, N.Y.

[73] Assignee: Nynex Science & Technologies, Inc., White Plains, N.Y.

[21] Appl. No.: 848,150

[22] Filed: Apr. 28, 1997

[51] Int. Cl.⁶ .............................. H04M 1/24; G01R 31/08
[52] U.S. Cl. .................................. 379/6; 379/24; 379/26; 379/30; 379/32; 324/525; 324/519; 324/527
[58] Field of Search .................................. 379/1, 5, 6, 22, 379/24, 26, 27, 30, 29, 32; 324/533, 532, 527, 534, 528, 541, 519, 523, 525, 537

[56] References Cited

U.S. PATENT DOCUMENTS

| | | | |
|---|---|---|---|
| 4,113,998 | 9/1978 | Ashdown et al. | 179/175.3 R |
| 4,139,745 | 2/1979 | Ashdown et al. | 179/175.3 F |
| 4,602,338 | 7/1986 | Cook | 379/6 |
| 4,611,101 | 9/1986 | Walter et al. | 179/175.3 R |
| 4,710,949 | 12/1987 | Ahuja | 379/26 |
| 4,777,645 | 10/1988 | Faith et al. | 379/31 |
| 5,073,920 | 12/1991 | Masukawa et al. | 379/30 |
| 5,128,619 | 7/1992 | Bjork et al. | 379/6 |
| 5,465,287 | 11/1995 | Egozi | 379/5 |
| 5,521,959 | 5/1996 | Walsworth et al. | 379/30 |

Primary Examiner—Paul Loomis
Attorney, Agent, or Firm—Robin, Blecker & Daley

[57] ABSTRACT

A telephone wire pair is qualified for digital signal transmission by central office testing. The tip-to-ring capacitance of the wire pair is measured while applying to the wire pair an AC test signal at 600 Hz. The test signal at this frequency minimizes errors due to line inductance and/or a ringing device connected to the wire pair. Reliable measurement of the length of the wire pair is achieved. Flaws in cable sheathing can also be detected based on measurement of tip-to-ground capacitance and/or ring-to-ground capacitance.

22 Claims, 2 Drawing Sheets

MEASURING T-R CAPACITANCE

DETECTING FLAWS IN CABLE SHEATH

QUALIFYING TELEPHONE LINE FOR DIGITAL TRANSMISSION SERVICE

FIELD OF THE INVENTION

This invention relates to testing procedures employed in a telephone central office, and more particularly is directed to determining the length of a telephone line extending from the central office to a subscriber's premises.

BACKGROUND OF THE INVENTION

In a typical installation, telephone service is provided between a central office and a customer's premises via a pair of wires, commonly referred to as "tip" and "ring". The tip and ring wires are twisted together and exit from the central office within a cable which typically includes a large of number of twisted wire pairs, enclosed in a metal jacket or sheath connected to ground. As the customers' premises vary in distance from the central office, so too is there substantial variation in the length of the wire pairs extending from the central office to the customer locations.

There has been increasing demand for transmission of digital data over conventional twisted pair telephone lines. One type of digital transmission service typically provided over twisted pair lines is referred to as ISDN (integrated services digital network). Reliable ISDN service cannot be provided over a twisted wire pair that has more than 42 dB of insertion loss, measured with a throughput frequency of 40 kHz. If a wire pair has an overall length of 18,000 feet, and is implemented according to standard practice with 10,500 feet of 26 AWG wire and 7,500 feet of 24 AWG wire, such a wire pair would have an insertion loss of about 42.6 dB at 70° F. If such a wire pair were installed in an aerial plant cable and exposed to sun loading in the summer, the insertion loss would be in excess of 42.6 dB. The inventor believes that a prudent policy would consider a wire pair qualified for ISDN service only if the length of the wire pair does not exceed 15,000 feet.

It would therefore be desirable to pre-qualify wire pairs for digital transmission service by a test procedure which measures the length of the wire pair from the central office to the customer premises.

It is known to attempt to measure the length of wire pairs from the central office using conventional test equipment such as the Model 105A remote test unit (RTU) marketed by Harris Corporation. When there is no terminal equipment having a ringer installed at the end of the wire pair, the Harris RTU can determine the length of the wire pair by measuring tip-to-ring (T-R) capacitance using a 30 Hz test signal. (Use of a 30 Hz test signal reflects teachings of U.S. Pat. Nos. 4,611,101 (Walter et al.); 4,113,998 (Ashdown et al.) ; and 4,139,745 (Ashdown et al.) These patents indicate that, in general, higher test frequencies produce less reliable results and are therefore undesirable.) If terminal equipment having a ringer is installed at the end of the wire pair, then tip-to-ground (T-G) and ring-to-ground (R-G) capacitance are measured to determine the length of the wire pair. However, there is a risk of substantial inaccuracy in all these measurements.

First of all, it often is not known a priori whether or not terminal equipment with a ringer is installed on the wire pair. If a ringer is present, there is a large change in the T-R capacitance measured at the central office, and therefore the T-R capacitance cannot be considered as a reliable indication of the wire pair length. The T-G and R-G capacitance measurements are also subject to significant unreliability, since the cable sheath may not be continuous. For example, it sometimes occurs that there is a failure to splice the sheath at the site of cable splices, or the sheath may experience corrosion over time which results in discontinuity. As a result, the length of the sheath indicated by the T-G and R-G capacitance measurements may be substantially different from the actual length of the wire pair in question.

OBJECTS AND SUMMARY OF THE INVENTION

It is an object of the invention to qualify a subscriber telephone line for digital transmission service by a central office test procedure which provides reliable results irrespective of whether terminal equipment is installed on the telephone line.

It is a more specific object of the invention to provide a reliable measurement of the effective length of the subscriber telephone line.

It is still a further object of the invention to detect discontinuities in the jacket or sheath of a telephone line.

According to an aspect of the invention, there is provided a method of qualifying a telephone wire pair for digital signal transmission, the wire pair consisting of a tip connection and a ring connection, the method including the steps of applying an AC test signal to the wire pair, the AC test signal being at a frequency higher than 200 Hz, and, during the applying step, measuring tip-to-ring capacitance of the wire pair. Other preferred ranges for the AC test signal includes 300 Hz to 1400 Hz, 450 Hz to 850 Hz, and 550 Hz to 650 Hz. A single preferred frequency for the AC test signal is substantially 600 Hz.

According to another aspect of the invention, there is provided telephone cable test apparatus for estimating an effective length of a telephone wire pair, the wire pair consisting of a tip connection and a ring connection, and the apparatus including generating circuitry for generating an AC test signal at a frequency greater than 200 Hz, a connection for applying to the wire pair the AC test signal generated by the generating circuitry, and circuitry for measuring tip-to-ring capacitance of the wire pair while the AC test signal is applied to the wire pair. The measuring circuitry and the connection for applying the test signal may include a bridge circuit.

According to still a further aspect of the invention, there is provided a method of detecting flaws in a telephone cable sheath, the sheath containing a plurality of twisted wire pairs each made up of a tip connection and a ring connection, and the method including the steps of selecting one of the twisted wire pairs contained in the telephone cable sheath, estimating a length of the sheath by first measuring tip-to-ring capacitance of the selected twisted wire pair, second measuring at least one of tip-to-ground (T-G) capacitance and ring-to-ground (R-G) capacitance with respect to the selected twisted wire pair, determining an expected T-G or R-G capacitance based on the estimated length of the sheath, and comparing the measured T-G or R-G capacitance with the expected T-G or R-G capacitance.

Further in accordance with the latter aspect of the invention, the second measuring step preferably includes measuring both T-G capacitance and R-G capacitance with respect to the selected twisted wire pair, the determining step includes determining both an expected T-G capacitance and an expected R-G capacitance based on the estimated length of the sheath, and the comparing step includes comparing the measured T-G capacitance and the measured R-G capacitance, respectively, to the expected T-G capacitance and the expected R-G capacitance. It is also preferred that the tip-to-ring capacitance is measured using an AC test signal at substantially 600 Hz.

Use of the method and apparatus of the present invention makes it possible to reliably measure the length of the subscriber telephone line without a priori knowledge as to whether a ringing device is connected to the line at the subscriber premises, and irrespective of the condition of the cable sheath which carries the line under test. Moreover, since the measurement is based on the detected tip-to-ring capacitance, the line length measurement can be used as a base line for detecting unsatisfactory conditions in the cable sheath on the basis of tip-to-ground and/or ring-to-ground capacitance measurements.

BRIEF DESCRIPTION OF THE DRAWINGS

The above and other features, advantages and aspects of the present invention will become more apparent upon reading the following detailed description in conjunction with the accompanying drawings, in which.

DETAILED DESCRIPTION

Figure 1:
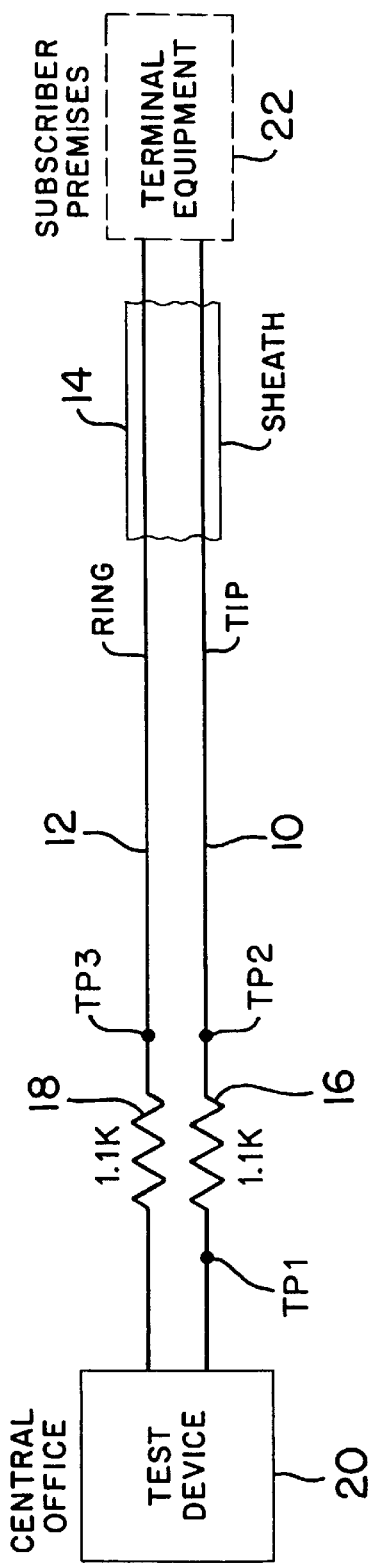
FIG. 1 schematically illustrates an arrangement in which the tip-to-ring capacitance of a subscriber telephone line is measured in accordance with the invention.

To overcome the unreliability inherent in the prior art distance measurements which utilize a 30 Hz test signal, calculation and experimentation were undertaken to determine an optimum test signal frequency. It was considered that an optimum frequency would minimize the errors respectively caused by both line inductance and the presence of a ringing device, if any. For purposes of calculation and experimentation, the length of the wire pair was taken to be about three miles, which is approximately the preferred limit to qualify for digital transmission service.

In terms of impedance characteristics, the wire pair may be modeled as an infinite number of infinitely small segments, each including a pure resistance, an inductance, and a shunt capacitance. To aid in calculation, a simpler model was adopted, consisting of three one-mile segments, each providing a resistive impedance R of 441 ohms, an inductance L of 0.986 mH and a capacitance C of 0.083 $\mu$F. If present, a ringing device provides an additional series inductance $L_{ringer}$ of 60 H and an additional shunt capacitance $C_{ringer}$ of 0.47 $\mu$F.

Using this model, a set of estimated impedance calculations was performed with respect to each of four test signal frequencies: 30 Hz, 300 Hz, 600 Hz and 3000 Hz. As to each frequency, three estimated calculations of line impedance were made: (a) assuming that no ringer was present, and without taking line inductance into account; (b) assuming no ringer was present, but considering line inductance; and (c) assuming a ringer to be present and considering the effect of line inductance.

The inductive component $Z_L$ of the impedance provided by each segment and by the ringer, if present, varies with the frequency f of the test signal according to the formula:

$$Z_L = 2\pi f L \qquad (1)$$

The capacitive impedance $Z_c$ of each section and of the ringer also varies with frequency, as indicated by the following formula:

$$Z_c = 1/(2\pi f C) \qquad (2)$$

Where the frequency of the test signal f was taken to be 30 Hz, the results of the calculations (a) and (b) differed by only a negligible amount (less than 0.01%), but the results of the calculations (b) and (c) differed by almost 50%. That is, the result of the calculation (c) provided an apparent impedance of just over one-half the result of the calculation (b). Thus, with the 30 Hz test signal, the presence of a ringer produces an extremely large error in the apparent length of the twisted wire pair.

When the test signal frequency f was taken to be 300 Hz, the difference in the results of the calculations (a) and (b) was about 0.1% and the difference between the result of the calculations (b) and (c) was about 1.3%. Accordingly, a 300 Hz test signal still produces negligible errors with regard to line inductance, but could expected to produce an error in excess of 1% if a ringer is present on the line.

When the test signal was taken to be 600 Hz, the error due to line inductance was less than one-third of 1%, and the error due to the presence of a ringing device was about 0.2%.

When the test signal frequency f was taken to be 3000 Hz, the error due to line inductance approached 3%, although the error due to the presence of a ringer became negligible (less than 0.01%).

On the basis of these calculations, 600 Hz is considered to be a preferred frequency for a test signal to be used in estimating the length of a subscriber line, since both line inductance and ringer errors are minimal at this frequency. A preferred range of test signal frequencies would be 550 Hz to 650 Hz, and even a broader range, of 450 to 800 Hz would be acceptable since both the line inductance error and the ringer error would, it is estimated, remain at 0.5% or below.

A still broader range of test signal frequencies of 300 Hz to 1400 Hz is also considered to be acceptable, since the line inductance and ringer errors would not exceed about 1% for test signals in this frequency range. Moreover, a test signal as low as 250 Hz, or even just above 200 Hz can also be expected to provide acceptable results, although with some increase in the error due to the presence of a ringing device. It is believed that test frequencies at 200 Hz or below would be subject to an unacceptable level of error when a ringing device was present.

FIG. 1 schematically illustrates an arrangement for measuring the length of a subscriber line by estimating the tip-to-ring capacitance of the subscriber line. In FIG. 1 the subscriber line is made up of a twisted pair comprising a tip connection 10 and a ring connection 12. In accordance with conventional practice, the twisted pair which constitutes the tip 10 and ring 12 is carried within a cable having an outer sheath 14. Typically, numerous other twisted wire pairs (not shown) are also included in the cable. The tip and ring wires 10 and 12 are respectively terminated at the central office side by resistors 16, 18. Connected across the central office side of the termination resistors 16, 18 is a test device 20. The test device 20 may, in a simple embodiment of the invention, be any circuitry adapted to generate a 600 Hz test signal. According to a preferred embodiment, the test device 20 may be a modified version of the aforesaid Harris model 105A RTU, adapted to generate a 600 Hz test signal in addition to or instead of the conventional 30 Hz test signal.

Also shown in FIG. 1, in phantom, is terminal equipment 22, which may or may not be installed at the subscriber premises side of the telephone line under test.

Figures 2, 3:
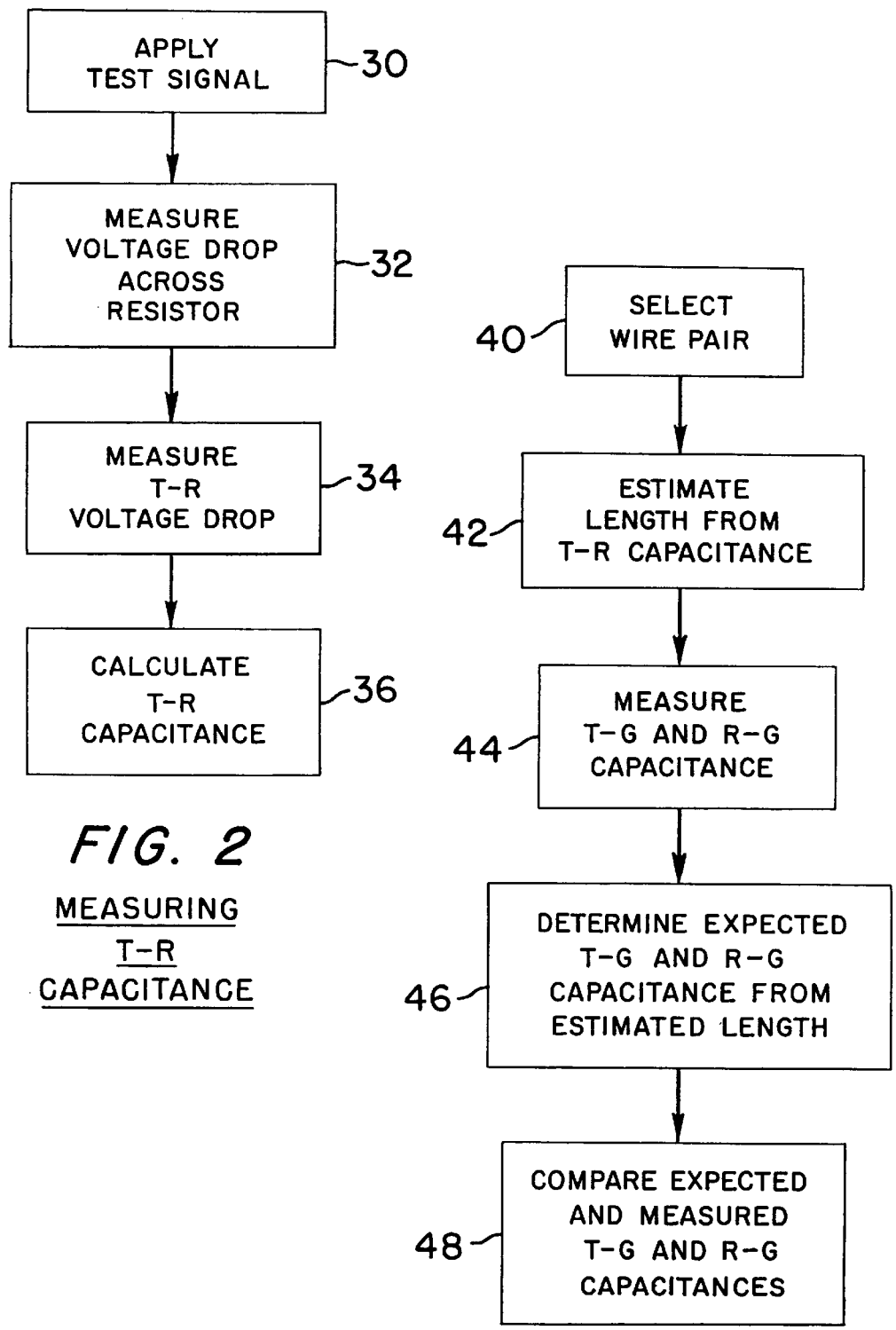
FIG. 2 is a flow diagram which illustrates a process for measuring tip-to-ring capacitance according to the invention.
FIG. 3 is a flow diagram which illustrates a process for detecting flaws in a telephone cable sheath in accordance with the invention.

FIG. 2 illustrates in flow-chart form a procedure by which the tip-to-ring capacitance is measured in the arrangement shown in FIG. 1. Initially, the 600 Hz test signal is applied to the subscriber line made up of the tip 10 and ring 12 (step 30). As the test signal continues to be applied, the potential drop $E_2$ across the termination resistor 16 is measured (step 32) by means of a voltmeter connected to test points TP1 and TP2. (Equivalently, the potential drop across the other termination resistor 18 may be measured.) Next, as indicated by step 34, and while the test signal continues to be applied, the potential drop $E_1$ from tip-to-ring is measured. That is, the potential drop across test points TP2 and TP3 is measured using the voltmeter. Based on the two measured values $E_1$ and $E_2$, the tip-to-ring capacitance can be calculated, according to a formula which is derived as follows.

The current I through the resistor 16 is related to the measured potential $E_2$ by $$I = E_2/R \quad (3)$$

where R is the value of the resistor 16 (in this case 1100 ohms). Moreover, the impedance $Z_{T-R}$ between the test points TP2 and TP3 is related to the measured potential $E_1$ by $$Z_{T-R} = E_1/I \quad (4)$$

Using equation (3) to substitute for I in equation (4) yields $$Z_{T-R} = (E_1 \cdot R)/E_2 \quad (5)$$

With the test signal at 600 Hz, the line inductance is negligible and the ringing device of the terminal equipment 22 (if present) is equivalent to an open circuit. Therefore $Z_{T-R}$ can be considered as essentially completely capacitive so that $$Z_{T-R} = 1/(2\pi f C) \quad (6)$$

Equating the two expressions for $Z_{T-R}$ from equations (5) and (6), and then solving for C provides:

$$C = (E_2/E_1)(1/(2\pi f R)) \quad (7)$$

When the values for the test signal frequency f (600 Hz) and the termination resistance R (1100 ohms) are plugged into the equation (7) the following formula results:

$$C = (2.41 \times 10^{-7})(E_2/E_1) \quad (8)$$

In a laboratory embodiment of the arrangement of FIG. 1, the telephone line represented by the tip and ring connections 10, 12 was implemented with 10,500 feet of 26 AWG cable plus 4,500 feet of 24 AWG cable. Capacitance measurements were made both with and without a telephone connected at the far end of the wire pair. The presence or absence of the telephone changed the measured potential drops, and the calculated tip-to-ring capacitance, by less than 1%. In both cases the measured values for $E_1$ and $E_2$ were about 2.50 volts and 2.23 volts, respectively, and the calculated value from the tip-to-ring capacitance was also about 0.215 $\mu$F.

It is believed that a tip-to-ring capacitance of 0.215 $\mu$F is a suitable threshold to qualify a subscriber line for digital transmission service, and that subscriber lines exhibiting this level of capacitance or less should be considered qualified for digital transmission service, when the tip-to-ring capacitance is measured with a suitable test signal such as 600 Hz.

Although the presence of bridge taps in the wire providing the subscriber line can cause the capacitance reading to increase, it is believed that the measured tip-to-ring capacitance value is a reasonably accurate indicator of insertion loss so that the 0.215 $\mu$F threshold level can be used regardless of the line geometry.

In the line qualification technique described above, the use of a test signal frequency which minimizes errors due to line inductance and the presence of a ringing device makes possible highly reliable tip-to-ring capacitance measurements which accurately reflect line length. Moreover, the availability of a technique for accurate line length measurement from the central office also makes it possible to detect flaws in the cable sheath by a testing procedure carried out in the central office. Such a procedure is illustrated in flow-diagram form in FIG. 3.

According to a first step, indicated as block 40 in FIG. 3, a wire pair in the cable is selected for testing. Then, as indicated at block 42, the length of the selected wire pair is estimated. This is done by determining the tip-to-ring capacitance according to the procedure discussed above and illustrated in FIG. 2 and then referring to a table which relates T-R capacitance to line length. Table 1 is such a table, and is made up of T-R capacitance measurements made in a laboratory by using known lengths of cable. It is well within the abilities of those having ordinary skill in the art to generate a more detailed table relating T-R capacitance to other line lengths.

TABLE 1

| LENGTH OF LINE (FEET) | T-R CAPACITANCE ($\mu$F) ($\pm$2%) |
| --- | --- |
| 5,000 | 0.076 |
| 10,000 | 0.153 |
| 15,000 | 0.215 |
| 18,000 | 0.276 |
| 32,000 | 0.398 |

Next (block 44), the tip-to-ground (T-G) and ring-to-ground (R-G) capacitances are measured according to known techniques. Then, at step 46, standard tables are referred to on the basis of the estimated line length derived at step 42, and expected values of T-G and R-G capacitance are determined by reference to the tables. The expected T-G and R-G capacitance values are compared with the measured values obtained at step 44, as indicated at block 48. If there is a significant divergence between the expected and the measured values, it can be inferred that there is a flaw in the cable sheath, such as a discontinuity in the sheath due to corrosion, a failure to splice the sheath at a cable splice point, or a failure to ground a segment of the cable sheath.

It should be understood that the order of steps 42, 44 and 46 is not critical. For example, step 46 can precede step 44, or step 44 can precede step 42.

By using the reliable indication of line length provided by the tip-ring capacitance determination of the procedure of FIG. 2, the procedure of FIG. 3 permits detection by central office testing of flaws in cable sheathing.

Figure 4:
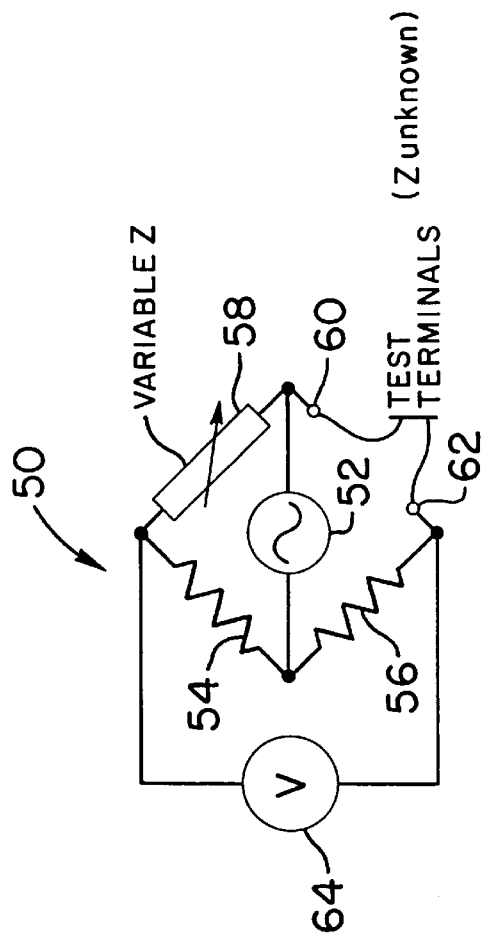
FIG. 4 schematically shows a bridge circuit used to measure tip-to-ring capacitance in accordance with an alternative embodiment of the invention.

In the procedure previously discussed in connection with FIG. 2, tip-to-ring capacitance was detected by using a voltmeter applied first to test points TP1 and TP2 and then to test points TP2 and TP3 (FIG. 1) to detect respective voltage drops between the respective pairs of test points. According to an alternative embodiment of the invention, a conventional bridge circuit testing arrangement may be used instead of a simple voltmeter. The bridge circuit arrangement, which is provided in conventional test units such as the Harris Model 105A, is schematically illustrated in FIG. 4.

The bridge circuit 50 includes a test signal generator 52, two essentially identical high precision resistors 54 and 56, a variable impedance element 58, test terminals 60 and 62 and a voltmeter 64. A series connection of the resistor 54 and the variable impedance element 58 is connected across the test signal generator 52. The test terminal 60 is at the junction of the variable impedance element 58 and the test signal generator 52. The other resistor 56 is connected between the test terminal 62 and the junction of the resistor 54 and the test signal generator 52. The voltmeter 64 is connected across the test terminal 62 and the junction of the resistor 54 and the variable impedance element 58.

The test terminals 60 and 62 are to be connected across the unknown impedance to be measured (in this case the tip-to-ring capacitance of the subscriber line shown in FIG. 1). That is, the test terminals 60 and 62 are connected respectively to test points TP2 and TP3 of FIG. 1.

The variable impedance element 58 includes a variable capacitor which is adjusted in value until the voltmeter 64 provides a zero reading. At that point, the bridge circuit 50 is in balance so that the impedance to be measured includes a capacitance which equals the present value of the variable capacitance of the element 58.

It is to be understood that the test signal generator 52 generates a test signal at a frequency of 600 Hz or another frequency within the preferred ranges disclosed above, rather than the conventional 30 Hz test signal.

In all cases it is understood that the above-arrangements are merely illustrative of the many possible specific embodiments which represent applications of the present invention. For example, it is contemplated that the test procedures described herein be carried out by automated test equipment. Numerous and varied other arrangements can be readily devised in accordance with the principles of the present invention without departing from the spirit and scope of the invention.

What is claimed is:

1. A method of qualifying a telephone wire pair for digital signal transmission, the wire pair consisting of a tip connection and a ring connection, the method comprising the steps of:
    applying an AC test signal to said wire pair, said AC test signal at a frequency greater than 200 Hz; and
    measuring tip-to-ring capacitance of said wire pair by using the applied AC test signal at said frequency greater than 200 Hz.

2. A method according to claim 1, wherein said AC test signal is at a frequency greater than 250 Hz.

3. A method according to claim 2, wherein said AC test signal is at a frequency greater than 300 Hz.

4. A method according to claim 2, wherein said AC test signal is in the range 300 Hz to 1400 Hz.

5. A method according to claim 4, wherein said AC test signal is in the range 450 Hz to 800 Hz.

6. A method according to claim 5, wherein said AC test signal is in the range 550 Hz to 650 Hz.

7. A method according to claim 6, wherein said AC test signal is substantially at 600 Hz.

8. A method according to claim 1, wherein said capacitance measuring step includes connecting a voltmeter across a terminating resistor for one of said tip connection and said ring connection.

9. A method according to claim 1, wherein said capacitance measuring step includes adjusting a variable capacitance included in an impedance bridge circuit connected between said tip connection and said ring connection.

10. Telephone cable test apparatus for estimating an effective length of a telephone wire pair, the wire pair consisting of a tip connection and a ring connection, the apparatus comprising:
    generating means for generating an AC test signal at a frequency greater than 200 Hz;
    means for applying to said wire pair said AC test signal generated by said generating means; and
    means for measuring tip-to-ring capacitance of said wire pair by using said AC test signal applied to said wire pair.

11. Apparatus according to claim 10, wherein said generating means generates said AC test signal at a frequency greater than 250 Hz.

12. Apparatus according to claim 11, wherein said generating means generates said AC test signal at a frequency greater than 300 Hz.

13. Apparatus according to claim 11, wherein said generating means generates said AC test signal at a frequency in the range 300 Hz to 1400 Hz.

14. Apparatus according to claim 13, wherein said generating means generates said AC test signal at a frequency in the range 450 Hz to 800 Hz.

15. Apparatus according to claim 14, wherein said generating means generates said AC test signal in the range 550 Hz to 650 Hz.

16. Apparatus according to claim 15, wherein said generating means generates said AC test signal at substantially 600 Hz.

17. Apparatus according to claim 10, wherein said means for applying and said means for measuring include a bridge circuit.

18. Apparatus according to claim 17, wherein said bridge circuit is connected between said tip connection and said ring connection, said bridge circuit including a variable capacitance.

19. Apparatus according to claim 10, wherein said means for measuring includes a voltmeter connected across a terminating resistor for one of said tip connection and said ring connection.

20. A method of detecting flaws in a telephone cable sheath, said sheath containing a plurality of twisted wire pairs each made up of a tip connection and a ring connection, the method comprising the steps of:
    selecting one of said twisted wire pairs contained in said telephone cable sheath;
    estimating a length of said sheath by first measuring tip-to-ring capacitance of said selected twisted wire pair;
    second measuring at least one of tip-to-ground (T-G) capacitance and ring-to-ground (R-G) capacitance with respect to the selected twisted wire pair;
    determining an expected T-G or R-G capacitance based on said estimated length of said sheath; and
    comparing said measured T-G or R-G capacitance with said expected T-G or R-G capacitance.

21. A method according to claim 20; wherein:
    said second measuring step includes measuring both T-G capacitance and R-G capacitance with respect to the selected twisted wire pair;
    said determining step includes determining both an expected T-G capacitance and an expected R-G capacitance based on said estimated length of said sheath; and
    said comparing step includes comparing said measured T-G capacitance and said measured R-G capacitance, respectively, to said expected T-G capacitance and said expected R-G capacitance.

22. A method according to claim 20, wherein said first measuring includes applying to the selected twisted wire pair an AC test signal at substantially 600 Hz.

* * * * *